(12) United States Patent
Chen

(10) Patent No.: US 11,955,453 B2
(45) Date of Patent: Apr. 9, 2024

(54) ELECTRONIC DEVICE

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 166 days.

(21) Appl. No.: 17/583,364

(22) Filed: Jan. 25, 2022

(65) Prior Publication Data

US 2022/0238477 A1 Jul. 28, 2022

(30) Foreign Application Priority Data

Jan. 25, 2021 (TW) .................. 110102694

(51) Int. Cl.
*H01L 23/00* (2006.01)
*H01L 25/04* (2023.01)
*H01L 25/075* (2006.01)

(52) U.S. Cl.
CPC .............. *H01L 24/73* (2013.01); *H01L 24/16* (2013.01); *H01L 24/17* (2013.01); *H01L 24/29* (2013.01);
(Continued)

(58) Field of Classification Search
CPC ..... H01L 24/16; H01L 24/33; H01L 25/0753; H01L 24/32; H01L 21/6835; H01L 24/83; H01L 31/0203; H01L 24/73; H01L 21/563; H01L 24/17; H01L 24/29; H01L 25/042; H01L 24/95; H01L 25/0655; H01L 33/62; H01L 25/50; H01L 23/49838; H01L 21/565; H01L 21/486; H01L 24/97; H01L 23/5383; H01L 21/4853; H01L 23/5384; H01L 23/562; H01L 25/105; H01L 23/5389; H01L 23/49822; H01L 21/4857; H01L 25/03; H01L 21/78; H01L 23/3114; H01L 27/156; H01L 33/44; H01L 2924/12041; H01L 2224/32056; H01L 2224/81203; H01L 2224/92125;
(Continued)

(56) References Cited

U.S. PATENT DOCUMENTS 6,512,031 B1 * 1/2003 Honda ................... C08G 59/18
257/E21.503
10,566,322 B2 * 2/2020 Chen ................. H01L 31/02005
(Continued)

*Primary Examiner* — Mouloucoulaye Inoussa
(74) *Attorney, Agent, or Firm* — Muncy, Geissler, Olds & Lowe, P.C.

(57) ABSTRACT

An electronic device includes a substrate, a plurality of micro semiconductor structure, a plurality of conductive members, and a non-conductive portion. The substrate has a first surface and a second surface opposite to each other. The micro semiconductor structures are distributed on the first surface of the substrate. The conductive members electrically connect the micro semiconductor structures to the substrate. Each conductive member is defined by an electrode of one of the micro semiconductor structures and a corresponding conductive pad on the substrate. The non-conductive portion is arranged on the first surface of the substrate. The non-conductive portion includes one or more non-conductive members, and the one or more non-conductive members are attached to the corresponding one or more conductive members of the one or more micro conductive structures.

16 Claims, 8 Drawing Sheets

(52) U.S. Cl.
CPC .............. *H01L 24/32* (2013.01); *H01L 24/33* (2013.01); *H01L 25/0753* (2013.01); *H01L 25/042* (2013.01); *H01L 2224/1601* (2013.01); *H01L 2224/16221* (2013.01); *H01L 2224/17134* (2013.01); *H01L 2224/2919* (2013.01); *H01L 2224/32053* (2013.01); *H01L 2224/32055* (2013.01); *H01L 2224/32056* (2013.01); *H01L 2224/32058* (2013.01); *H01L 2224/32059* (2013.01); *H01L 2224/32221* (2013.01); *H01L 2224/33051* (2013.01); *H01L 2224/33132* (2013.01); *H01L 2224/33133* (2013.01); *H01L 2224/73204* (2013.01); *H01L 2924/12041* (2013.01); *H01L 2924/12043* (2013.01)

(58) Field of Classification Search
CPC . H01L 2224/33132; H01L 2224/33051; H01L 2224/83102; H01L 2224/33133; H01L 2924/12043; H01L 2221/68363; H01L 2224/2919; H01L 2224/32221; H01L 2224/32055; H01L 2224/32225; H01L 2224/48227; H01L 2225/1023; H01L 2221/68359; H01L 2225/1058; H01L 2225/1088; H01L 2924/19105; H01L 2224/81005; H01L 2225/0651; H01L 2221/68331; H01L 2924/19106; H01L 2924/1434; H01L 2933/0066; H01L 2224/13099; H01L 2224/73204; H01L 2224/16225; H01L 2924/00012; G06Q 50/01; G06Q 99/00; G06F 16/435; G06F 16/9535; G06F 16/24
USPC ........ 428/332, 457, 414, 447; 257/735, 738, 257/99, 737, 774, E25.011, E25.023, 257/E25.012, E23.19; 438/126, 107, 127, 438/613
See application file for complete search history.

(56) References Cited

U.S. PATENT DOCUMENTS

| | | | | |
|---|---|---|---|---|
| 10,600,932 | B2* | 3/2020 | Chen | H01L 33/52 |
| 2008/0156437 | A1* | 7/2008 | Kawate | H05K 3/361 |
| | | | | 156/330 |
| 2009/0014873 | A1* | 1/2009 | Yokota | H01L 23/3185 |
| | | | | 257/737 |
| 2010/0321916 | A1* | 12/2010 | Yoshida | H05K 3/361 |
| | | | | 29/830 |
| 2013/0005085 | A1* | 1/2013 | Shibuya | H01L 21/565 |
| | | | | 438/126 |
| 2013/0062748 | A1* | 3/2013 | Tabei | C08F 210/14 |
| | | | | 257/676 |
| 2013/0131281 | A1* | 5/2013 | Gronowski | C08F 8/22 |
| | | | | 525/356 |
| 2013/0280886 | A1* | 10/2013 | Kato | B32B 7/06 |
| | | | | 438/455 |
| 2014/0063768 | A1* | 3/2014 | Tanaka | H05K 1/185 |
| | | | | 29/830 |
| 2014/0367150 | A1* | 12/2014 | Inoue | B32B 15/14 |
| | | | | 428/221 |
| 2015/0179570 | A1* | 6/2015 | Marimuthu | H01L 24/97 |
| | | | | 438/126 |
| 2018/0025992 | A1* | 1/2018 | Hung | H01L 25/50 |
| | | | | 257/668 |
| 2018/0286824 | A1* | 10/2018 | Jeng | H01L 25/0655 |
| 2019/0109174 | A1* | 4/2019 | Chu | H01L 27/156 |
| 2019/0131281 | A1* | 5/2019 | Liu | H01L 33/38 |
| 2019/0131282 | A1* | 5/2019 | Liu | H01L 24/81 |
| 2019/0181122 | A1* | 6/2019 | Hsu | H01L 33/62 |
| 2020/0126963 | A1* | 4/2020 | Lee | H01L 33/62 |
| 2020/0373282 | A1* | 11/2020 | Liu | H01L 25/167 |
| 2021/0092835 | A1* | 3/2021 | Watanabe | H01L 23/12 |
| 2021/0119098 | A1* | 4/2021 | Kajiyama | H01L 25/0753 |
| 2021/0202817 | A1* | 7/2021 | Nigo | H10N 10/854 |
| 2021/0296248 | A1* | 9/2021 | Khim | H01L 21/565 |
| 2021/0296249 | A1* | 9/2021 | Khim | H01L 21/6835 |

* cited by examiner

ELECTRONIC DEVICE

CROSS REFERENCE TO RELATED APPLICATIONS

This Non-provisional application claims priority under 35 U.S.C. § 119(a) on Patent Application No(s). 110102694 filed in Taiwan, Republic of China on Jan. 25, 2021, the entire contents of which are hereby incorporated by reference.

BACKGROUND

Technology Field

The present disclosure relates to an electronic device and, in particular, to an electronic device with micro semiconductor structures.

Description of Related Art

Conventionally, the conductive structure can be formed on a target circuit substrate by surface mounting technology (SMT) such as solder paste printing or ball grid array (BGA) technology. However, these surface mounting technology cannot be applied to micro electronic devices with a size of less than 100 microns in accuracy.

In addition, another conventional method is to coat the anisotropic conductive paste (ACP) on the target circuit substrate for forming the conductive structure. However, in order to adapt to the different distances between the conductive pads on the target circuit substrate, or in order to adapt to the target circuit substrate with conductive pads of different scales, the anisotropic conductive paste or adhesive with a higher particle filling rate is usually used. The conductive particles are filled inside the paste (thermosetting paste or thermoplastic paste) in a three-dimensional distribution, thereby providing the conductive function to the conductive pads in the highest probability. However, only a small part of the conductive particles can provide the conductive function to the conductive pads on the target circuit substrate, and the remaining conductive particles, the most part, are sealed in the cured paste above the target circuit substrate. Therefore, the more expensive conductive particles are wasted. In addition, for micro LEDs (light emitting diodes), because the size thereof is quite small (e.g., 50 μm or smaller), it is not suitable to electrically connect the electrodes with the conventional wire bonding or eutectic bonding apparatus.

Therefore, it is desired to provide a corresponding solution for performing electrical connection of the micro semiconductor structure in micron level or smaller.

SUMMARY

The present disclosure provides an electronic device that can electrically connect the micron level or smaller micro semiconductor structure(s) to a substrate.

One or more exemplary embodiments of this present disclosure provide an electronic device, which includes a substrate, a plurality of micro semiconductor structure, a plurality of conductive members, and a non-conductive portion. The substrate has a first surface and a second surface opposite to each other. The micro semiconductor structures are distributed on the first surface of the substrate. The conductive members electrically connect the micro semiconductor structures to the substrate. Each conductive member is defined by an electrode or one of electrodes of the corresponding micro semiconductor structure and a corresponding conductive pad on the substrate. The non-conductive portion are arranged on the first surface of the substrate. The non-conductive portion includes one or more non-conductive members, and the one or more non-conductive members are attached to the corresponding one or more conductive members of the one or more micro conductive structures.

In some exemplary embodiments, each conductive member includes a metal material selected from copper, nickel, tin, silver, gallium, gold, and indium, or an alloy or a compound containing one or more of copper, nickel, tin, silver, gallium, gold, and indium.

In some exemplary embodiments, the non-conductive portion includes a polymer with one or more siloxane chains (—Si—O—Si—).

In some exemplary embodiments, the non-conductive portion includes a polymer with one or more epoxy groups (—CH—O—CH—).

In some exemplary embodiments, the non-conductive portion has an epoxy value less than 0.25.

In some exemplary embodiments, the non-conductive portion is a photoresist.

In some exemplary embodiments, one of the non-conductive members completely covers the corresponding one or more conductive members.

In some exemplary embodiments, one of the non-conductive members covers at least a part of the corresponding one or more micro semiconductor structures.

In some exemplary embodiments, the non-conductive members are separated and independent from each other.

In some exemplary embodiments, the non-conductive members are connected to each other.

In some exemplary embodiments, each of the conductive members is defined with a joint interface between the corresponding electrode and the corresponding conductive pad, and the top of each non-conductive member is higher than the joint interface of the one or more conductive members.

In some exemplary embodiments, each micro conductive structure corresponds to two of the conductive members.

In some exemplary embodiments, the height of the conductive member is greater than or equal to 2 μm and less than or equal to 6 μm.

In some exemplary embodiments, the width of the conductive member is less than or equal to 20 μm.

In some exemplary embodiments, the distance between two conductive members corresponding to one of the micro semiconductor structures is less than or equal to 30 μm.

In some exemplary embodiments, each of the micro semiconductor structures is a micron level or smaller photoelectric die with horizontal type electrodes, vertical type electrodes, or flip-chip type electrodes.

One or more exemplary embodiments of this present disclosure also provide a manufacturing method of an electronic device, comprising the following steps of:
  preparing a substrate structure, wherein the substrate structure includes a substrate, a plurality of micro semiconductor structures, and a plurality of conductive members, and each conductive member electrically connects the corresponding micro semiconductor structure to the substrate.
  applying a non-conductive material in a pre-coating pattern on the substrate structure, wherein the non-conductive material is a fluid, and the non-conductive material attaches the conductive members along the substrate; and the non-conductive material forming a non-conductive portion on the substrate based on an insulation pattern, wherein the non-conductive portion includes one or more non-conductive members, one of the non-conductive members attaches to more than one of the conductive members, and the insulation pattern is partially overlapped with the pre-coating pattern.

In some exemplary embodiments, the step of preparing the substrate structure includes: electrically connecting the micro semiconductor structures to the substrate, wherein the substrate includes a plurality of conductive pads, one surface of each micro semiconductor structure facing the substrate has at least one electrode, and each conductive member is defined by one of the conductive pads and an electrode or one of electrodes of the corresponding micro semiconductor structure.

In some exemplary embodiments, the step of preparing the substrate structure includes: heat pressing or laser welding one of the conductive pads and the electrode or one of the electrodes of the corresponding substrate structure so as to form one of the conductive members.

In some exemplary embodiments, in the step of preparing the substrate structure, each of the conductive members comprises a metal material selected from copper, nickel, tin, silver, gallium, gold, and indium, or an alloy or a compound containing one or more of copper, nickel, tin, silver, gallium, gold, and indium.

In some exemplary embodiments, in the step of applying the non-conductive material, one non-conductive material is applied between adjacent micro semiconductor structures.

In some exemplary embodiments, in the step of applying the non-conductive material, the non-conductive materials at applied at the same time or sequentially.

In some exemplary embodiments, before the step of forming the non-conductive portion, the manufacturing method further includes: statically placing the substrate structure applied with the non-conductive material at room temperature for 1 to 24 hrs.

In some exemplary embodiments, before the step of forming the non-conductive portion, the manufacturing method further includes: statically placing the substrate structure applied with the non-conductive material at 40 to 80° C. for 0.1 to 4 hrs.

In some exemplary embodiments, in the step of applying the non-conductive material, the viscosity of the non-conductive material is less than or equal to 3 Pa·s.

In some exemplary embodiments, in the step of applying the non-conductive material, the non-conductive portion formed from the non-conductive material includes a plurality of non-conductive members, and each non-conductive member attaches to the conductive member(s) of the corresponding micro conductive structure(s).

In some exemplary embodiments, in the step of applying the non-conductive material, the non-conductive members are separated and independent from each other.

In some exemplary embodiments, after the step of forming the non-conductive portion, the manufacturing method further includes: removing residuals of each micro semiconductor structure on the substrate.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Figure 1:
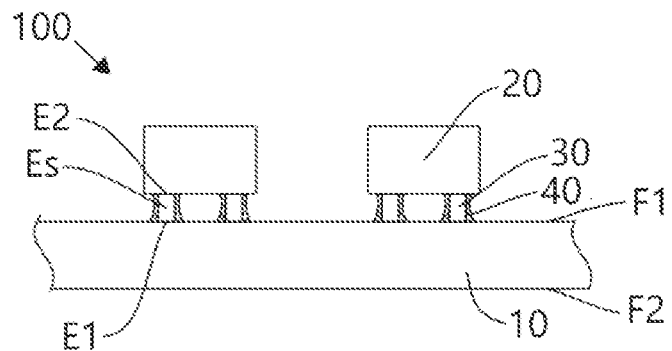
FIG. 1, FIGS. 1A to 1E and FIG. 2 are schematic diagrams showing electronic devices according to different embodiments of this disclosure.

The present disclosure will be apparent from the following detailed description, which proceeds with reference to the accompanying drawings, wherein the same references relate to the same elements.

The terms used in this disclosure are defined and explained as follow. The term "micro" semiconductor structure and "micro" semiconductor device are used synonymously and generally refer to the scale of micrometers or below. The terms "semiconductor structure" and "semiconductor device" are used synonymously and generally refer to a semiconductor material, die, structure, device, component of device, or semi-finished product. The term "semiconductor structure" used herein includes high-quality monocrystalline semiconductors and polycrystalline semiconductors, semiconductor materials manufactured through high-temperature processing, doped semiconductor materials, organic and inorganic semiconductors, and composed semiconductor materials and structures having one or more additional semiconductor components or non-semiconductor components (e.g. dielectric layers or materials, or conductive layers or materials). The semiconductor components include, for example but are not limited to, transistors, photovoltaic devices (including solar cells), diodes, photodiodes, light-emitting diodes, laser diodes, antennas, integrated circuits, and semiconductor devices and device assemblies of sensors. In addition, a semiconductor component may refer to a component or part of a functional semiconductor device or product. The word "substrate" used herein refers to a non-native substrate for receiving the micro semiconductor structures, wherein it can be an intermediate substrate or a final substrate during the manufacturing process. In some embodiments, the material of the native substrate or the non-native substrate includes high-molecular polymers or non-high-molecular polymers, such as plastic or resin (e.g., polyethylene naphthalate, polyethylene terephthalate (PET or PETE), polyimide (PI), polyethylene (PE), polyvinyl chloride (PVC), polystyrene (PS), acrylic, fluoropolymer, polyester or nylon), or such as metal, metal foil, semiconductor, ceramic, glass, flexible glass, quartz, sapphire, or silicon-based materials, or such as metal-glass fiber composite materials, metal-ceramic composite materials, or composite materials composed of any of the aforementioned materials. In addition, the "substrate" can be configured with an active circuit including active components. For example, the active component can be a silicon IC or a thin film transistor (TFT). In other embodiments, the "substrate" can be configured with a passive circuit including none of active components, such as a conductive pattern layer or the likes. The term "electronic device" used herein can be, for example, photoelectric semiconductor devices or microwave array devices applied to, for example, display panels, billboards, antenna devices, sensing devices, backlight modules or lighting devices. If the photoelectric semiconductor device is a display device, it can be a monochrome or full-color display device.

The specific embodiments of this disclosure are described in detail with reference to related drawings, wherein the same components will be described with the same reference numbers or symbols. The illustrations of all implementation aspects of the disclosure are merely illustrative, and do not represent the actual sizes or proportions. In addition, the definition of the sequence and the relationship between the elements, unless defined in the text, are only for illustration and description.

The following embodiment will be described with reference to FIGS. 1, 1A, 1B, and 2. As shown in FIG. 1, an electronic device 100 of this disclosure includes a substrate 10, a plurality of micro semiconductor structure 20, a plurality of conductive members 30, and a non-conductive portion. The substrate 10 has a first surface F1 and a second surface F2, which are opposite to each other. The micro semiconductor structures 20 are distributed on the first surface F1 of the substrate 10, and the conductive members 30 are distributed on the first surface F1 of the substrate 10. The non-conductive portion includes one or more non-conductive members 40, and the non-conductive members 40 are separated and independent from each other. Each conductive member 30 is composed of one of electrodes of one corresponding micro semiconductor structure 20 and a corresponding conductive pad on the substrate 10. Each conductive member 30 has one end E1 connecting to the substrate 10, another end E2 connecting to the micro semiconductor structure 20, and a joint interface Es between the two ends E1 and E2. Herein, the joint interface Es indicates the interface between the electrode of the micro semiconductor structure 20 and the conductive pad of the substrate 10. The non-conductive portion are arranged on the first surface F1 of the substrate 10, and the one or more non-conductive members 40 are attached to the corresponding one or more conductive members 30 of the one or more micro conductive structures 20. In some embodiments, one non-conductive member 40 is attached to the corresponding conductive members 30 of parts or all of the micro conductive structures 20. In some embodiments, parts of the non-conductive members 40 are attached to the conductive members 30 of parts or all of the corresponding micro conductive structures 20. In some embodiments, the non-conductive members 40 are attached to the conductive members 30 of parts or all of the micro conductive structures 20. In some embodiments, the non-conductive member 40 is attached to at least one part of the corresponding micro conductive structure 20. In some embodiments, the non-conductive member 40 is at least attached to the joint interface Es of the corresponding conductive member 30.

In this embodiment, the micro semiconductor structure 20 is, for example, a micro photodiode, and each micro semiconductor structure 20 can be a micron level or smaller micro photoelectric die with horizontal type, vertical type or flip-chip type electrodes. To be understood, the size of micron level (micrometers, μm) also includes hundreds of μm, 100 μm, or less than 100 μm (e.g. 50 μm or 80 μm), and the size of smaller than micron level may include nanometer level (e.g. 50 nm, 10 nm or 5 nm). Each conductive member 30 is a metal material selected from copper, nickel, tin, silver, gallium, gold, and indium, or an alloy or a compound containing one or more of copper, nickel, tin, silver, gallium, gold, and indium. In this embodiment, the non-conductive members 40 are separated and independent from each other, and the number of the non-conductive members 40 is in a one-to-one configuration with the number of the conductive members 30.

In some embodiments, the micro semiconductor structure 20 and the substrate 10 are electrically connected by two conductive members 30. In some embodiments, the height of each conductive member 30 is greater than or equal to 2 μm and less than or equal to 6 μm. For example, the height of each conductive member 30 can be 2 μm, 3 μm, 4 μm, 5 μm, or 6 μm. In some embodiments, the width of the conductive member 30 is less than or equal to 20 μm. For example, the width of the conductive member 30 can be 3 μm, 5 μm, 8 μm, 15 μm, or 20 μm. In some embodiments, the distance between two conductive members 30 of one of the micro semiconductor structures 20 is greater than or equal to 3 μm and less than or equal to 30 μm. For example, the distance between two conductive members 30 can be 3 μm, 5 μm, 8 μm, 10 μm, 15 μm, 20 μm, or 30 μm. In some embodiments, each of the non-conductive members 40 has a height greater than or equal to 0.5 μm. For example, the height of each non-conductive element 40 can be 2 μm or 3 μm. In some embodiments, the height of each non-conductive member 40 can be higher than the distance between the joint interface Es and the first surface F1 of the substrate 10, but this disclosure is not limited thereto. It can be understood that the height of each non-conductive member 40 is measured starting from the first surface F1 of the substrate 10.

In some embodiments, at least one of the non-conductive members 40 completely covers the corresponding one or more conductive members 30 of the corresponding one or more micro semiconductor structures 20. In some embodiments, the diameter of one end of the non-conductive member 40 (i.e., the end corresponding to the end E1 or E2) is greater than the diameter of the middle section of the non-conductive member 40 (i.e., the position corresponding to the joint interface Es). In some embodiments, each non-conductive member 40 includes a polymer with one or more siloxane chains (—Si—O—Si—). In some embodiments, each non-conductive member 40 includes a polymer with one or more epoxy groups (—CH—O—CH—). In some embodiments, each non-conductive member 40 has an epoxy value less than 0.25.

Figure 1A:
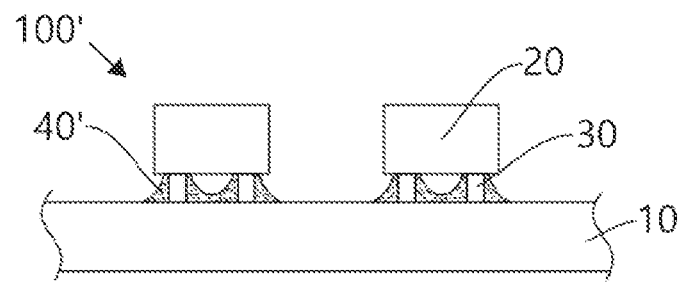

In some embodiments, the non-conductive members 40' and the conductive members 30 are in a one-to-many configuration. For example, as shown in FIG. 1A, each micro semiconductor structure 20 and the substrate 10 are electrically connected by two conductive members 30, and one non-conductive member 40' is attached to two conductive members 30 at the same time (see the electronic device 100' as shown in FIG. 1A). In this case, the non-conductive members 40' and the micro semiconductor structures 20 are in a one-to-one configuration. In some embodiments, the non-conductive members 40' do not fully cover the two conductive members 30 of the micro semiconductor structures 20, but this disclosure is not limited thereto.

Figure 1B:
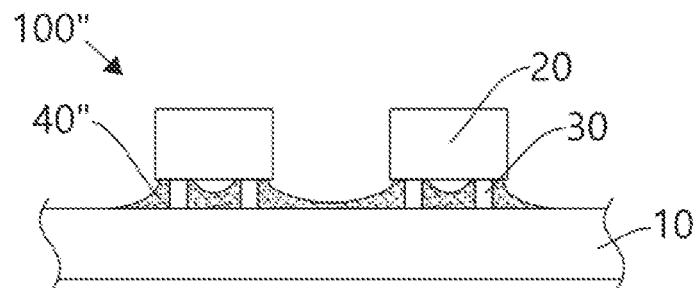

In some embodiments, the non-conductive members 40" and the conductive members 30 are still in a one-to-many configuration, and the non-conductive members 40" and the micro semiconductor structures 20 are also in a one-to-many configuration (see the electronic device 100" as shown in FIG. 1B). That is, one non-conductive member 40" is attached to one of the conductive members 30 in one micro semiconductor structure 20 and one of the conductive members 30 in one adjacent micro semiconductor structure 20.

As shown in FIG. 1B, for example, one non-conductive member 40" is attached to two conductive members 30 in two adjacent micro semiconductor structures 20, respectively. In this embodiment, it is not limited whether the non-conductive member 40" is fully filled between the two conductive members 30 of one corresponding micro semiconductor structure 20. For example, one of the non-conductive members 40" is not fully filled between the two conductive members 30 of one corresponding micro semiconductor structure 20, and another one of the non-conductive members 40" is fully filled between the two conductive members 30 of another one corresponding micro semiconductor structure 20.

Figure 1C:
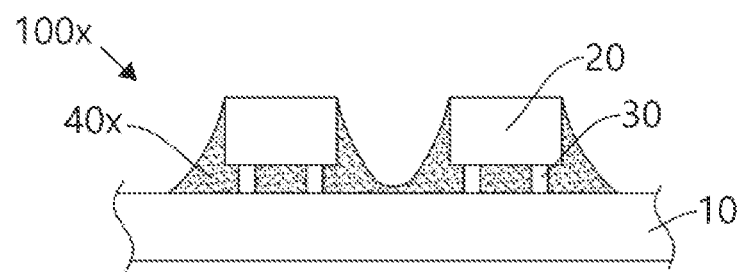
Figure 1D:
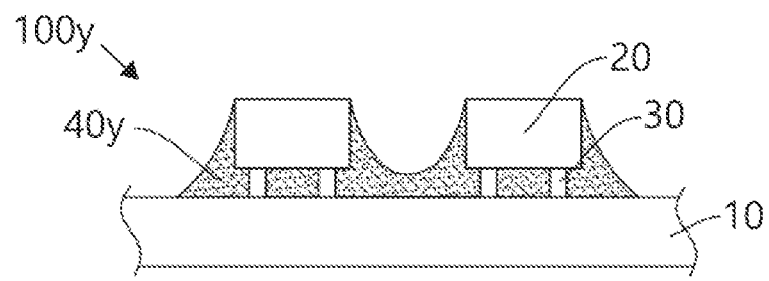
Figure 1E:
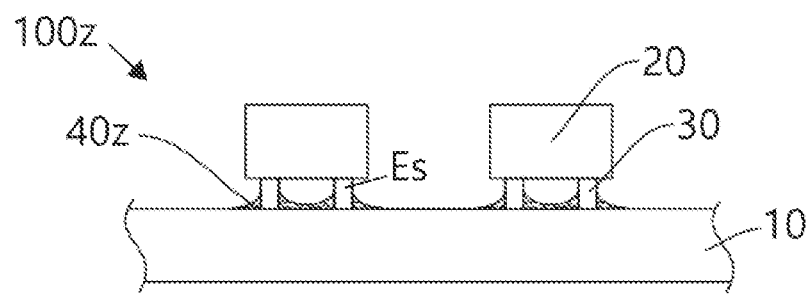

In some embodiments, regardless of the configuration of the non-conductive members 40x and the conductive members 30 and the configuration of the non-conductive member 40x and the micro semiconductor structure 20, the non-conductive member 40x is further attached to the top edge or top surface of the corresponding one or more micro semiconductor structures 20. In the electronic device 100x as shown in FIG. 1C, the height of the non-conductive member 40x is equal to or exceeds the overall height of the micro semiconductor structures 20 and the conductive members 30. In another case, the non-conductive member 40y is attached to the sidewall of the corresponding micro semiconductor structure 20. In the electronic device 100y as shown in FIG. 1D, the height of the non-conductive member 40y does not exceed the overall height of the micro semiconductor structures 20 and the conductive members 30. In another case, the non-conductive member 40z is attached to the sidewall of the corresponding conductive member 30. In the electronic device 100z as shown in FIG. 1E, the height of the non-conductive member 40z does not exceed the overall height of the conductive member 30. In some embodiments, the non-conductive member 40 is attached to at least the joint interface Es of the corresponding conductive member 30, but this disclosure is not limited thereto.

Figure 2:
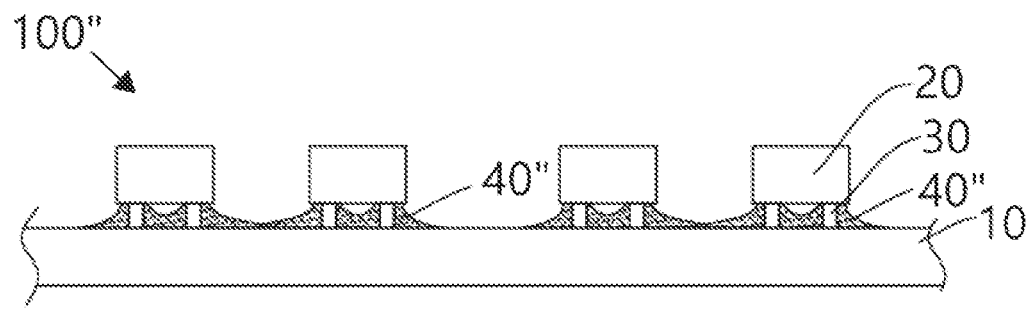

In addition, the example as shown in FIG. 2 includes two or more independent non-conductive members 40", and each non-conductive member 40" is simultaneously attached to at least one conductive member 30 in a plurality of adjacent micro semiconductor structures 20. In this embodiment, each non-conductive member 40" is simultaneously attached to the conductive members 30 in two adjacent micro semiconductor structures 20, and different non-conductive members 40" can attach different numbers of micro semiconductor structures 20. This disclosure is not limited thereto.

Figures 3, 3A:
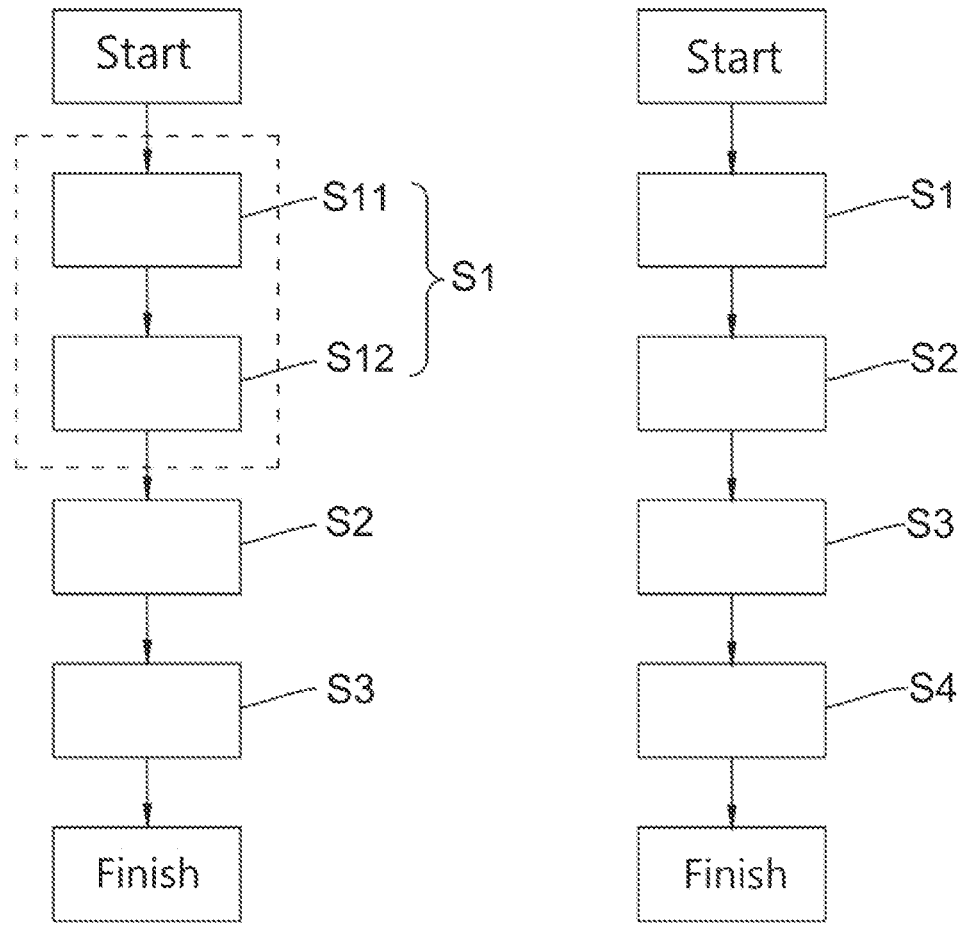
FIG. 3 and FIGS. 3A to 3C are flow charts of manufacturing methods of an electronic device according to different embodiments of this disclosure.
Figure 4A:
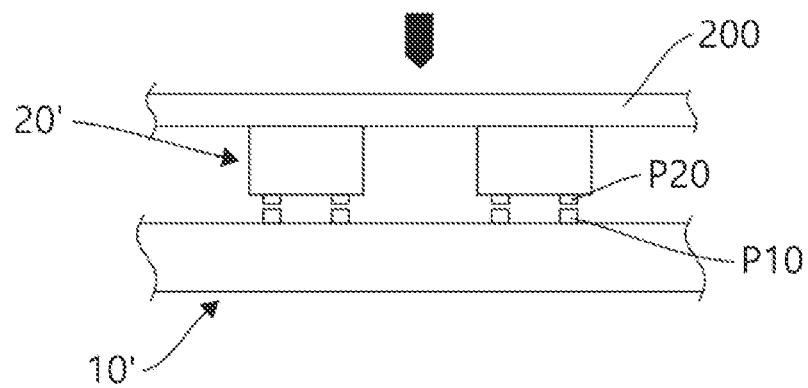
FIGS. 4A to 4D are schematic diagrams showing the manufacturing procedure of FIG. 3.
Figure 5:
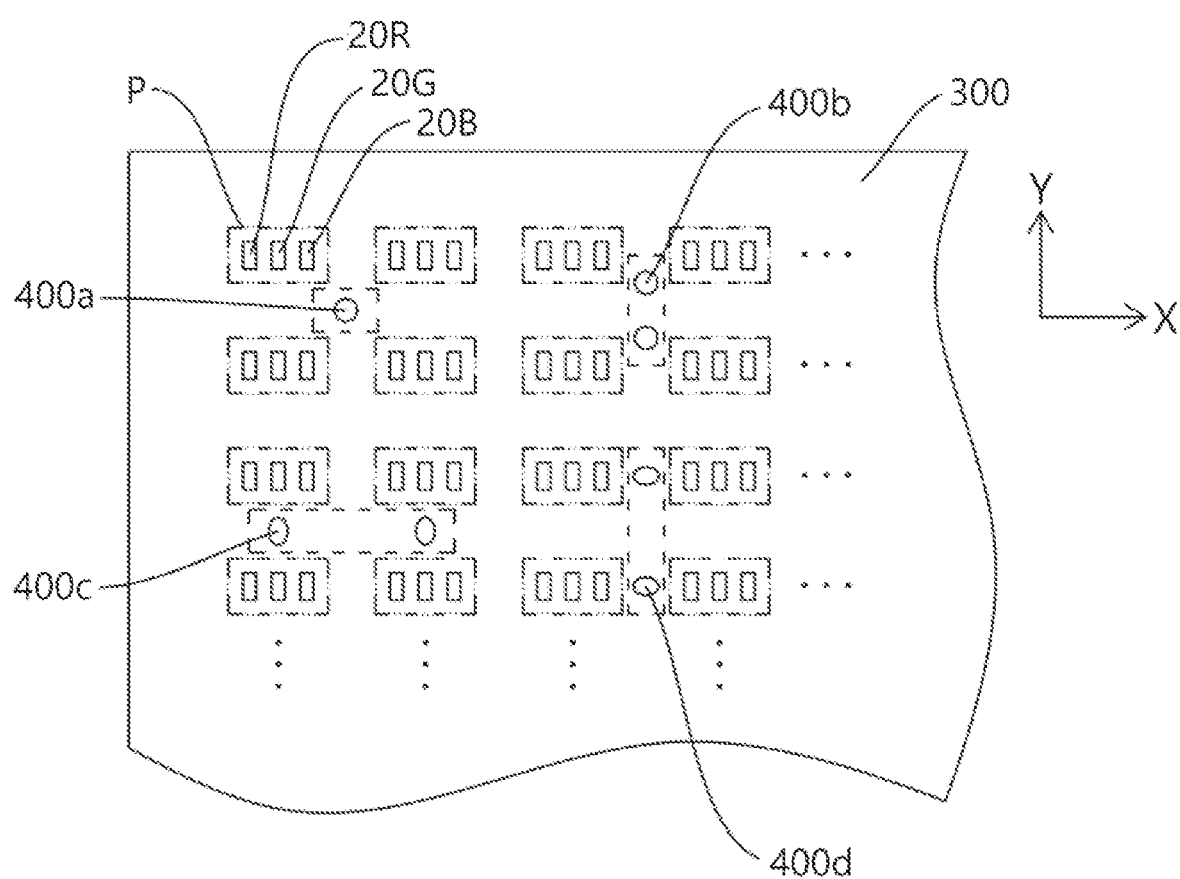
FIGS. 5 and 6 are schematic diagrams showing the pre-coating pattern and the insulation pattern on the electronic device, respectively.
Figure 6:
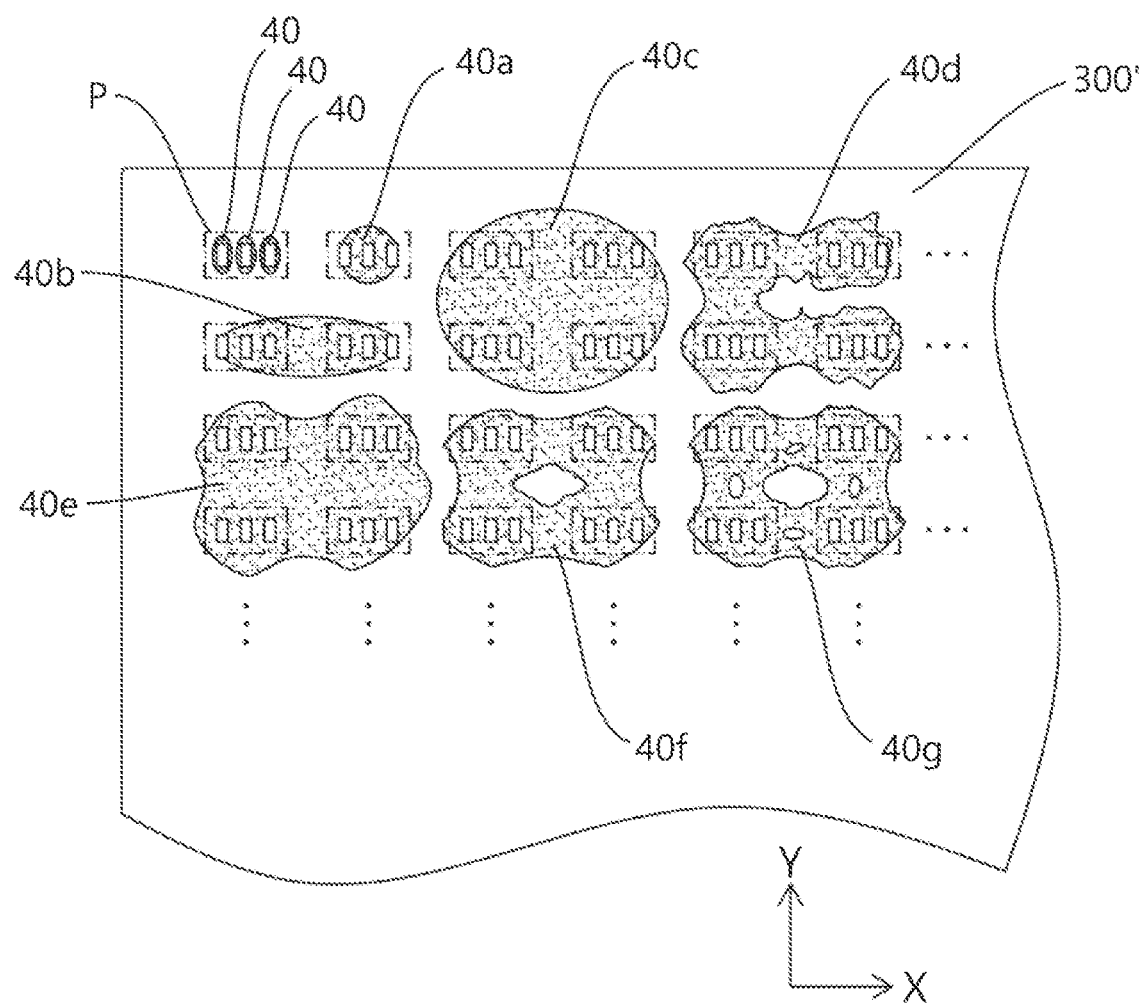

The following embodiment will be described with reference to FIG. 3, FIG. 4A to FIG. 4D, FIG. 5 and FIG. 6. FIG. 3 illustrates the manufacturing method of the electronic device 100. FIG. 4A to FIG. 4D are schematic diagrams corresponding to the steps as shown in FIG. 3. FIG. 5 represents the pre-coating pattern in the step S2, and FIG. 6 represents the insulation pattern in the step S3.

FIG. 3 shows a manufacturing method of an electronic device including the steps S1 to S3.

Figure 4B:
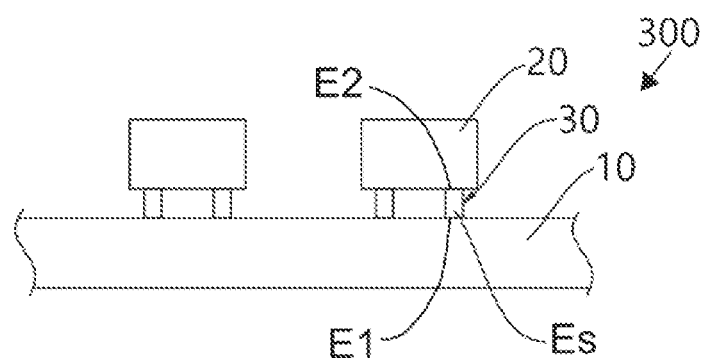

The step S1 is to prepare a substrate structure 300 as shown in FIG. 4B. The substrate structure 300 includes a substrate 10, a plurality of micro semiconductor structures 20, and a plurality of conductive members 30, and each conductive member 30 electrically connects the corresponding micro semiconductor structure 20 to the substrate 10. In this case, each conductive member 30 has one end E1 connecting to the substrate 10, and one end E2 opposite to the end E1 and connecting to the corresponding micro semiconductor structure 20. The step S1 further includes a step S11 and a step S12.

In the step S11, as shown in FIG. 4A, a plurality of micro semiconductor structures 20' are placed on a carrier device 200, and one surface of the carrier device 200 arranged with the plurality of micro semiconductor structures 20' is approaching a substrate 10'. In this case, the surface of the micro semiconductor structure 20' facing the substrate 10' has at least one electrode P20, and the surface of the substrate 10' facing the micro semiconductor structure 20' has a plurality of conductive pads P10.

In the step S12, the electrodes P20 of the micro semiconductor structures 20' are connected to the corresponding conductive pads P10 of the substrate 10' by heat pressing or laser welding so as to form the conductive members 30 as shown in FIG. 4B. The conductive member 30 is defined with a joint interface Es of the electrode P20 and the conductive pad P10.

Figure 4C:
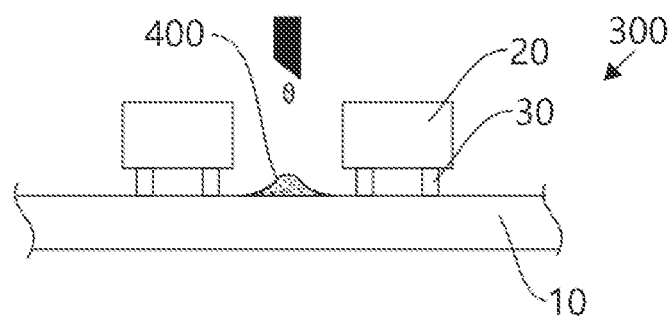

As shown in FIG. 4C, the step S2 is to applying a non-conductive material 400 on the substrate structure 300, wherein the non-conductive material 400 is a fluid, and the non-conductive material 400 attaches the conductive members 30 along the substrate 10.

Figure 4D:
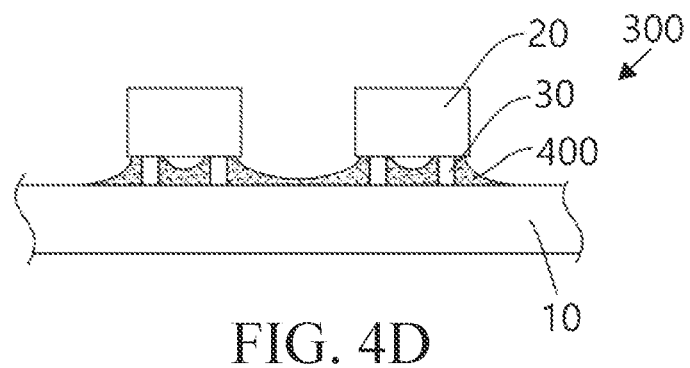

In some embodiments, the adhesive force between the non-conductive material 400 and the substrate 10 is greater than the cohesive force of the non-conductive material 400, but this disclosure is not limited thereto. In some embodiments, the non-conductive material 400 can be a fluid with a viscosity less than or equal to 3 Pa·s. For example, the non-conductive material 400 can be a fluid with a viscosity less than or equal to 2 Pa·s, or less than or equal to 1 Pa·s. The non-conductive material 400 can diffuse on the first surface F1 of the substrate 10 and approach the adjacent one or more of the micro semiconductor structures 20. In some embodiments, the substrate 10 can at least form a polarity on the first surface F1, thereby improving the adhesive force between the non-conductive material 400 and the substrate 10. In addition, since the adhesive force between the non-conductive material 400 and the conductive member 30 on the substrate structure 300 is greater than the cohesive force of the non-conductive material 400, the non-conductive material 400 can cling to and cover at least a part of the conductive member 30 due to capillary phenomenon. In some embodiments, the non-conductive material 400 is attached to at least the joint interface Es of the corresponding conductive member 30, but this disclosure is not limited thereto. In some embodiments, the non-conductive material 400 completely covers the conductive member 30. As shown in FIG. 4D, the non-conductive material 400 covers the corresponding conductive member 30 from the end E1 to the end E2.

In some embodiments, the non-conductive material 400 is a polymer with epoxy group (—CH—O—CH—). In some embodiments, the non-conductive material 400 has an epoxy value less than 0.25. In some embodiments, the non-conductive material 400 is a polymer with siloxane chain (—Si—O—Si—).

In this embodiment, the viscosity of the non-conductive material 400 is less than or equal to 3 Pa·s (poise). Furthermore, the non-conductive material 400 is a polymer having a viscosity less than or equal to 3 Pa·s. In some embodiments, the viscosity of the non-conductive material 400 is less than or equal to 2 Pa·s or 1 Pa·s. In some embodiments, each non-conductive material 400 has acid resistance.

For easy understanding, in the step of applying the non-conductive material 400 on the substrate structure 300 based on the pre-coating pattern, a plurality of pre-coating patterns for applying the non-conductive materials can be prepared as shown in FIG. 5, but this disclosure is not limited thereto. For example, as shown in FIG. 5, a plurality of micro semiconductor structures on the substrate structure 300 are used as a pixel unit P (e.g. a color display device, which is represented by dot-and-dash lines), which includes a micron-level red LED die 20R, a micron-level green LED die 20G, and a micron-level blue LED die 20B. Regarding different pixel units P, one non-conductive material 400a can be applied between four adjacent pixel units P. Regarding different pixel units P, one non-conductive material 400b can be applied between corners of two adjacent pixel units P. Regarding different pixel units P, one non-conductive material 400c can be applied between two adjacent pixel units P along the X axis. Regarding different pixel units P, one non-conductive material 400d can be applied between two adjacent pixel units P along the Y axis. In the same pixel unit P, a plurality of non-conductive materials can correspond to and be respectively attached to a plurality of conductive materials (not shown) of the micro semiconductor structure. In some embodiments, the non-conductive materials can be applied in array, randomly applied, applied in spin, or irregularly applied. In some embodiments, the non-conductive materials can be applied simultaneously or sequentially.

In the step S3, the non-conductive material 400 forms a non-conductive portion on the substrate 10 based on an insulation pattern, wherein the non-conductive portion attaches to the conductive members 30, and the insulation pattern is partially overlapped with the pre-coating pattern.

In some embodiments, after forming the non-conductive material 400 on the substrate 10, the manufacturing method further includes: statically placing the substrate structure applied with the non-conductive material 400 at room temperature for 1 to 24 hrs., thereby forming the above-mentioned non-conductive portion. In this case, the room temperature can be, for example, 20 to 30° C.

In some embodiments, after forming the non-conductive material 400 on the substrate 10, the manufacturing method further includes: statically placing the substrate structure applied with the non-conductive material 400 at 40 to 80° C. for 0.1 to 4 hrs., thereby forming the above-mentioned non-conductive portion.

In addition, the non-conductive portion formed by the non-conductive material 400 can include one or more non-conductive members 40. Each non-conductive member 40 is attached to a corresponding one or more of the conductive members 30 of parts or all of the corresponding micro semiconductor structures. For easy understanding, still taking a plurality of pixel units P on the substrate structure 300 as an example, FIG. 6 shows various insulation patterns for forming the non-conductive portion (non-conductive members) on the substrate structure 300', but this disclosure is not limited thereto. For example, in the same pixel unit P, a plurality of non-conductive members 40 can correspond to and be respectively attached to at least one conductive material of a plurality of micro semiconductor structures. In the same pixel unit P, one non-conductive member 40a can be correspondingly attached to a plurality of conductive materials of a plurality of micro semiconductor structure. In different pixel units P, one conductive member 40b can be correspondingly attached to a plurality of conductive materials of a plurality of micro semiconductor structures in two adjacent pixel units P along the X axis. In different pixel units P, one conductive member 40c can be correspondingly attached to a plurality of conductive materials of a plurality of micro semiconductor structures in four adjacent pixel units P. In different pixel units P, one conductive member 40c, 40e can be correspondingly attached to a plurality of conductive materials of a plurality of micro semiconductor structures in four adjacent pixel units P, and each conductive member 40c or 40e is a continuous (uninterrupted) structure. In different pixel units P, one conductive member 40d, 40f or 40g can be correspondingly attached to a plurality of conductive materials of a plurality of micro semiconductor structures in four adjacent pixel units P. The differences are that the conductive members 40d, 40f and 40g have different sizes of vacancies, and each of them can still be used as one conductive material in this disclosure.

Figure 7A:
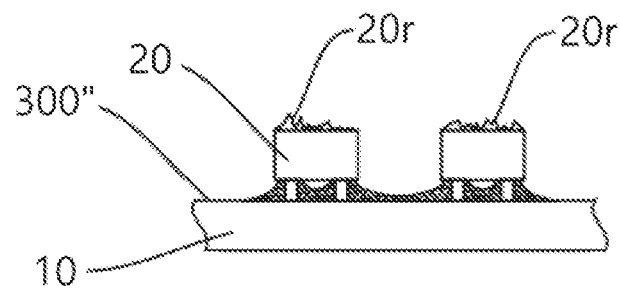
FIGS. 7A to 7C are schematic diagrams showing the manufacturing procedure of FIG. 3A.

Please refer to FIG. 3A and FIG. 7A to FIG. 7C. FIG. 3A shows the steps S1 to S4. After each of the micro semiconductor structures 20 on the substrate structure 300" is separated from a substrate (not shown), each of the micro semiconductor structures 20 still contains a residue 20r (e.g. Gallium) as shown in FIG. 7A. Therefore, FIG. 3A further includes a step S4 of: removing the residue 20r.

Figure 7B:
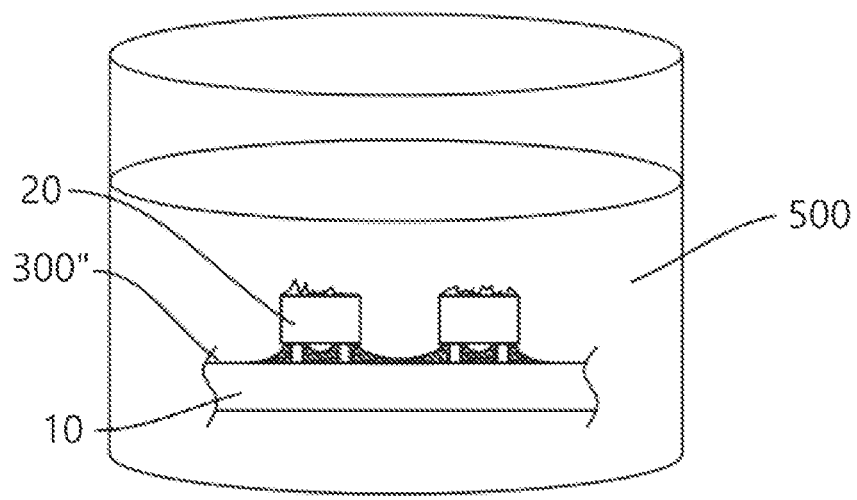
Figure 7C:
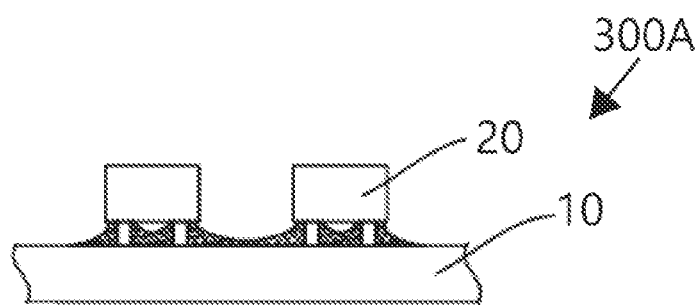

The method for removing the residue includes: placing the substrate structure 300" together with the micro semiconductor structures 20 in an acid solution 500 as shown in FIG. 7B; and washing the individual micro semiconductor structures 20 on the substrate structure 300" by the acid solution 50 to remove the residue 22r, thereby forming a substrate structure 300A. Accordingly, the micro semiconductor structure 20 can have better luminous efficiency. The non-conductive portion (non-conductive members) of the substrate structure 300 can further protect the conductive member 30 from being corroded by the acid solution. In some embodiments, the acid solution 500 includes hydrochloric acid.

Figure 3B:
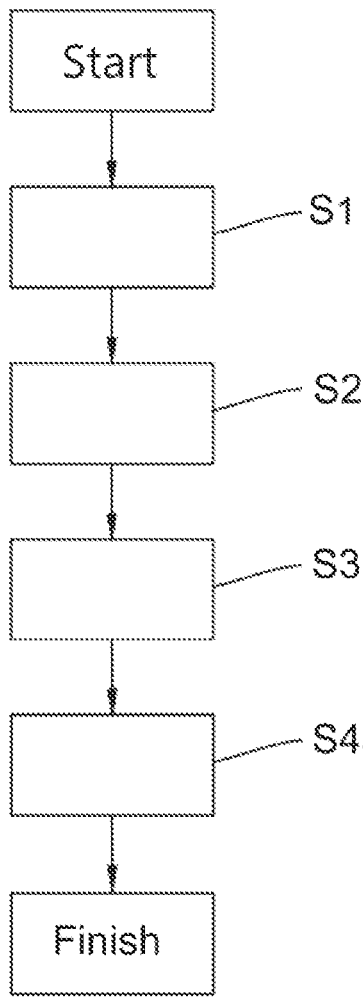

In another aspect, with reference to FIG. 3B, the method for removing residues includes (step S4a): placing the substrate structure 300" together with the micro semiconductor structures 20 in a liquid substance at a temperature greater than or equal to 30° C.; and removing the residue 2r of each micro semiconductor structure 20 on the substrate structure 300". In some embodiments, the liquid substance can be, for example, water, ethanol or isopropanol.

In another aspect, the step S4a further includes: providing ultrasonic vibration when the substrate structure 300" together with the micro semiconductor structure 20 are placed in the liquid substance.

Figure 3C:
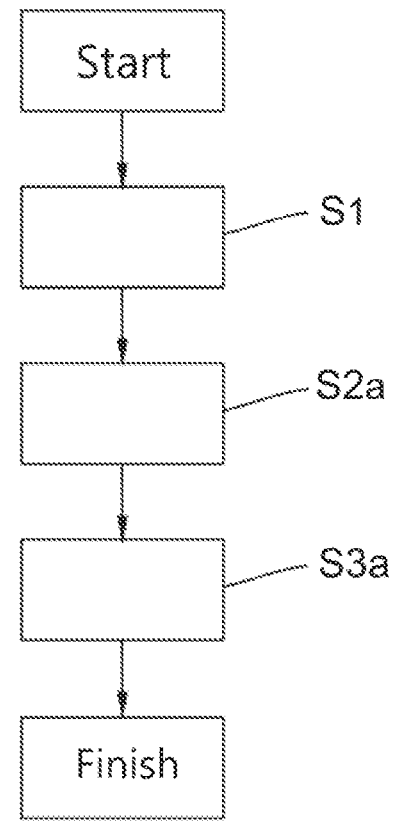

In the embodiment of FIG. 3C, another kind of non-conductive material is used.

The step S1 is still to prepare a substrate structure, wherein the substrate structure includes a substrate, a plurality of micro semiconductor structures, and a plurality of conductive members. The details of this step can refer to the above embodiment, so the detailed descriptions thereof will be omitted.

The step S2a is to apply a non-conductive material on the substrate structure, wherein the non-conductive material is attached to the conductive members along the substrate, and the non-conductive material can climb to at least a part of the conductive member due to capillary phenomenon. Different from the previous embodiment, the non-conductive material of this embodiment is a liquid photoresist material.

The step S3a is to perform a photolithography process on the non-conductive material on the substrate structure to form a non-conductive portion according to an insulation pattern. In this embodiment, the photolithography process can include, for example but not limited to, steps of softbaking (pre-baking), exposure (e.g. excimer laser with ultraviolet wavelength), development, and photoresist removal.

In the following embodiment, another new non-conductive material (not shown) is used.

In this embodiment, the step S1 and the step S3 (step S3a) can refer to the above embodiments, so the detailed descriptions thereof will be omitted.

The step S2a is to apply a non-conductive material on the substrate structure, wherein the non-conductive material is attached to the conductive member along the substrate, and the non-conductive material can climb to at least a part of the conductive member due to capillary phenomenon. Different from the previous embodiments, the non-conductive material of this embodiment is a dark coating material. To be understood, the non-conductive material of this embodiment can be any of the materials mentioned in this disclosure, and is further mixed with a light absorbing substance that absorbs visible light to form a dark coating material, such as a black coating. Therefore, when the electronic device is a photoelectric device, the black coating can reduce the influence of external ambient light on the electronic device, so as to improve the contrast effect of the electronic device. To be understood, in some embodiments, the non-conductive material of this embodiment is fully (or nearly fully) coated.

Since the size of the micro semiconductor structures is extremely tiny, the arrangement density thereof can be relatively increased, so that the fabricated electronic device 100 or the substrate structure 300" applied to a photoelectric semiconductor device can have a relatively high component density. The disclosure can fabricate the electronic device 100 by a simpler manufacturing method, and can protect the conductive member in a lower cost and higher efficiency method.

To sum up, in the electronic device and the manufacturing method of the same of this disclosure, the conductive members are formed between the micro semiconductor structure and the substrate (by heat pressing or laser welding) before applying the non-conductive material, so that the non-conductive material can adhere and climb to at least a part of the conductive member due to capillary phenomenon. The effects of this disclosure are stated as follow (but not limited thereto):

1. The conductive member(s) can be formed between each micro semiconductor structure and the substrate by heat pressing or laser welding, and the non-conductive material in a fluid state applied between each micro semiconductor structure and the substrate can adhere and climb to at least a part of the aforementioned conductive member due to capillary phenomenon. Accordingly, not only the manufacturing process is simplified, but also the manufacturing cost is reduced.

2. The conductive member(s) between each micro semiconductor structure and the substrate can be attached by the non-conductive portion to achieve a better stability at least between the conductive member(s) and the substrate.

3. The conductive particles of, for example, anisotropic conductive paste or adhesive are not needed, which greatly reduces the cost.

4. The conductive member(s) between each micro semiconductor structure and the substrate can be attached by the non-conductive portion for providing the acid resistance ability, which is beneficial to protect the joint interface of the conductive member during the following pickling process for removing the residues on the micro semiconductor structures.

5. When using warm water (or neutral substance fluid) to remove the residues on the micro semiconductor structures, the exposed (if any) joint interface of the conductive member is not damaged, the process is relatively simple, and the cost is greatly reduced.

6. When the electronic device is a photoelectric device and the non-conductive material is a dark coating, the influence of external ambient light on the electronic device can be reduced, and the contrast effect of the electronic device can be further improved.

7. It allows the flexible applications of the ultra-thin, fragile and/or micro semiconductor structures without causing damage to the micro semiconductor structures themselves.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
   a substrate having a first surface and a second surface opposite to each other;
   a plurality of micro semiconductor structures distributed on the first surface of the substrate;
   a plurality of conductive members electrically connecting the micro semiconductor structures to the substrate, wherein each of the conductive members is defined by an electrode of one of the micro semiconductor structures and a corresponding conductive pad on the substrate, and
   a non-conductive portion arranged on the first surface of the substrate, wherein the non-conductive portion comprises one or more non-conductive members, and the one or more non-conductive members are attached to the corresponding one or more conductive members of the one or more micro conductive structures;
   wherein, the one or more micro conductive structures comprise a top edge, and the one or more non-conductive members are further attached to the top edge of the corresponding one or more micro conductive structures; and
   wherein, the one or more non-conductive members comprises a non-conductive material, and an adhesive force between the non-conductive material and the conductive members is greater than a cohesive force of the non-conductive material.

2. The electronic device of claim 1, wherein each of the conductive members comprises a metal material selected from copper, nickel, tin, silver, gallium, gold, and indium, or an alloy or a compound containing one or more of copper, nickel, tin, silver, gallium, gold, and indium.

3. The electronic device of claim 1, wherein the non-conductive portion comprises a polymer with one or more siloxane chains (—Si—O—Si—).

4. The electronic device of claim 1, wherein the non-conductive portion comprises a polymer with one or more epoxy groups (—CH—O—CH—).

5. The electronic device of claim 4, wherein the non-conductive portion has an epoxy value less than 0.25.

6. The electronic device of claim 1, wherein the non-conductive portion is a photoresist.

7. The electronic device of claim 1, wherein one of the non-conductive members completely covers the corresponding one or more conductive members.

8. The electronic device of claim 1, wherein one of the non-conductive members covers at least a part of the corresponding one or more micro semiconductor structures.

9. The electronic device of claim 1, wherein the non-conductive members are separated and independent from each other.

10. The electronic device of claim 1, wherein the non-conductive members are connected to each other.

11. The electronic device of claim 1, wherein each of the conductive members is defined with a joint interface between the corresponding electrode and the corresponding conductive pad, and a top of each of the non-conductive members is higher than the joint interface of the one or more conductive members.

12. The electronic device of claim 1, wherein each of the micro conductive structures corresponds to two of the conductive members.

13. The electronic device of claim 1, wherein a height of the conductive member is greater than or equal to 2 μm and less than or equal to 6 μm.

14. The electronic device of claim 1, wherein a width of the conductive member is less than or equal to 20 μm.

15. The electronic device of claim 12, wherein a distance between the two conductive members corresponding to one of the micro semiconductor structures is less than or equal to 30 μm.

16. The electronic device of claim 1, wherein each of the micro semiconductor structures is a micron level or smaller photoelectric die with horizontal type electrodes, vertical type electrodes, or flip-chip type electrodes.

* * * * *